United States Patent
Gibbs

(10) Patent No.: US 6,694,229 B1
(45) Date of Patent: Feb. 17, 2004

(54) METHOD FOR SIMPLIFYING MANUAL RADIO FREQUENCY ENTRIES

(75) Inventor: Michael J. Gibbs, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/326,194

(22) Filed: Dec. 20, 2002

(51) Int. Cl.[7] ............................................. G06F 15/20
(52) U.S. Cl. ......................................................... 701/3
(58) Field of Search .............................. 701/3, 17, 36; 340/870.08, 825.74; 455/150.1, 151.1, 154.1, 154.2, 160.1, 158.2, 166.1, 166.2, 176.1, 179.1, 180.1, 180.2, 186.2, 188.1, 188.2

(56) References Cited

U.S. PATENT DOCUMENTS 5,086,504 A * 2/1992 Nemeth-Johannes et al. .... 717/143
6,289,207 B1 * 9/2001 Hudecek et al. ......... 455/150.1

FOREIGN PATENT DOCUMENTS

| EP | 0 241 717 | * | 3/1987 | ........... G06F/15/20 |
| EP | WO 98/15057 | * | 4/1998 | ............. H03J/1/00 |

* cited by examiner

Primary Examiner—Thu Nguyen

(57) ABSTRACT

A method for expediting the entry of a radio frequency into a radio control device by allowing entry of only a portion of the actual frequency desired comprising the steps of parsing the portion of the actual frequency entered, comparing the portion of the actual frequency entered to known characteristics of permissible frequencies, choosing a permissible frequency that is uniquely compatible with the portion of the actual frequency entered, and entering the uniquely compatible frequency into the radio control device.

20 Claims, 15 Drawing Sheets

US 6,694,229 B1

METHOD FOR SIMPLIFYING MANUAL RADIO FREQUENCY ENTRIES

FIELD OF THE INVENTION

The present invention generally relates to avionics systems and more particularly relates to a method for simplifying the entry of radio frequencies into aircraft flight control systems.

BACKGROUND OF THE INVENTION

Aircraft typically have a number of radios for communications and for navigation. In order to control the operation of these radios, many commercial aircraft utilize Radio Management Units (RMUs) as control heads that allow the entry of radio frequencies by selecting a field on a display associated with the RMU and turning, for example, a dual-concentric knob until the desired frequency appears on the display. Newer aircraft utilize Multifunction Control and Display Units (MCDUs) as the control head for all the aircraft's communications and navigational needs, and as the controller for the aircraft's flight plan information. Combining most navigation, communication, and flight planning functions into one unit also saves space and weight, which is desirable in any aircraft. In order to enter a radio frequency into an MCDU, a keypad is provided for the pilot or crewmember to manually enter the desired frequencies into the system. The MCDU may also have alternate data entry mechanisms such as rotary switches or the like for entering frequencies or other data.

Depending upon the type of radio, navigation radios, which may include VOR navigation, ADF navigation, or any other navigation system, or communications radios, and the frequency spacing provided by the radio, entering a frequency can require up to seven keystrokes. During the entry of radio frequencies the crewmember must concentrate upon the MCDU and its display to ensure accuracy of the entries. This requires the crewmember to constantly observe the display to the exclusion of observing th e surroundings of the aircraft.

Pilots and other crewmembers have sought relief from the need to type frequency entries that include the decimal point. A complete entry for a Very High Frequency (VHF) communications radio that uses 8.33 KHz frequency spacing consists of 7 characters–3 digits to the left and right of a decimal point. A complete VHF navigation frequency or a VHF communications frequency at 25 KHz spacing requires 6 characters–3 to the left and 2 to the right of a decimal point. A complete Automatic Direction Finder (ADF) frequency requires 5 or 6 characters–3 or 4 to the left and 1 to the right of the decimal point. By using knowledge of the acceptable frequency range, spacing, and common pilot/air traffic controller shorthand for each radio type the number of characters required for some entries can be reduced to as few as two characters.

Accordingly, it is desirable to simplify and shorten the making of keypad entries of radio frequencies into an MCDU. This also requires that a means to validate the entry and a syntax that the crewmember must use for that entry be provided. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

The foregoing and other desirable features may be accomplished by providing a method for expediting the entry of a radio frequency into a radio control device by allowing entry of only a portion of the actual frequency desired comprising the steps of parsing the portion of the actual frequency entered, comparing the portion of the actual frequency entered to known characteristics of permissible frequencies, choosing a permissible frequency that is uniquely compatible with the portion of the actual frequency entered, and entering the uniquely compatible frequency into the radio control device.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the drawings.

This invention provides a method for accepting and validating radio frequency entries into an MCDU that is very permissive, yet highly accurate in its interpretations. (While the invention is being described in terms a method for use with an MCDU, the invention could likewise be implemented utilizing other radio control heads or integrated systems.) It accomplishes this through a method that utilizes knowledge of the valid frequency ranges, frequency spacing, and usage for each of several radio types. In addition, the common shorthand forms that crewmembers and air traffic controllers use for certain frequency ranges are supported to ensure that the actual result matches the expected result.

For example, when a controller instructs a pilot to tune "one twenty three point six five" the pilot will often reply with "twenty three sixty five," because all VHF communications frequencies are in the 100 MHz range and they have traditionally used two digits after the decimal place. A system employing the method described below would allow the pilot or crewmember to type exactly what he or she read back ( "2365") and it would be interpreted as "123.650".

The method accomplishes more than simply inserting a decimal point in the middle of the pilot's entry. It can determine the correct decimal point placement and append assumed digits even in cases where the entered value is very short. To tune 123.000 MHz, for example, any of the following entries would be allowed: "123", "230", "2300", "23000", "23.0", "23.000" or even "23".

This preferred embodiment of this invention is an implementation in software and that implementation is depicted in the diagrams that follow. After performing the processing in accordance with the flow charts depicted herein, the crew entry is converted into an appropriate numerical format and checked against the proper frequency range for the radio type using conventional methods.

Figure 1:
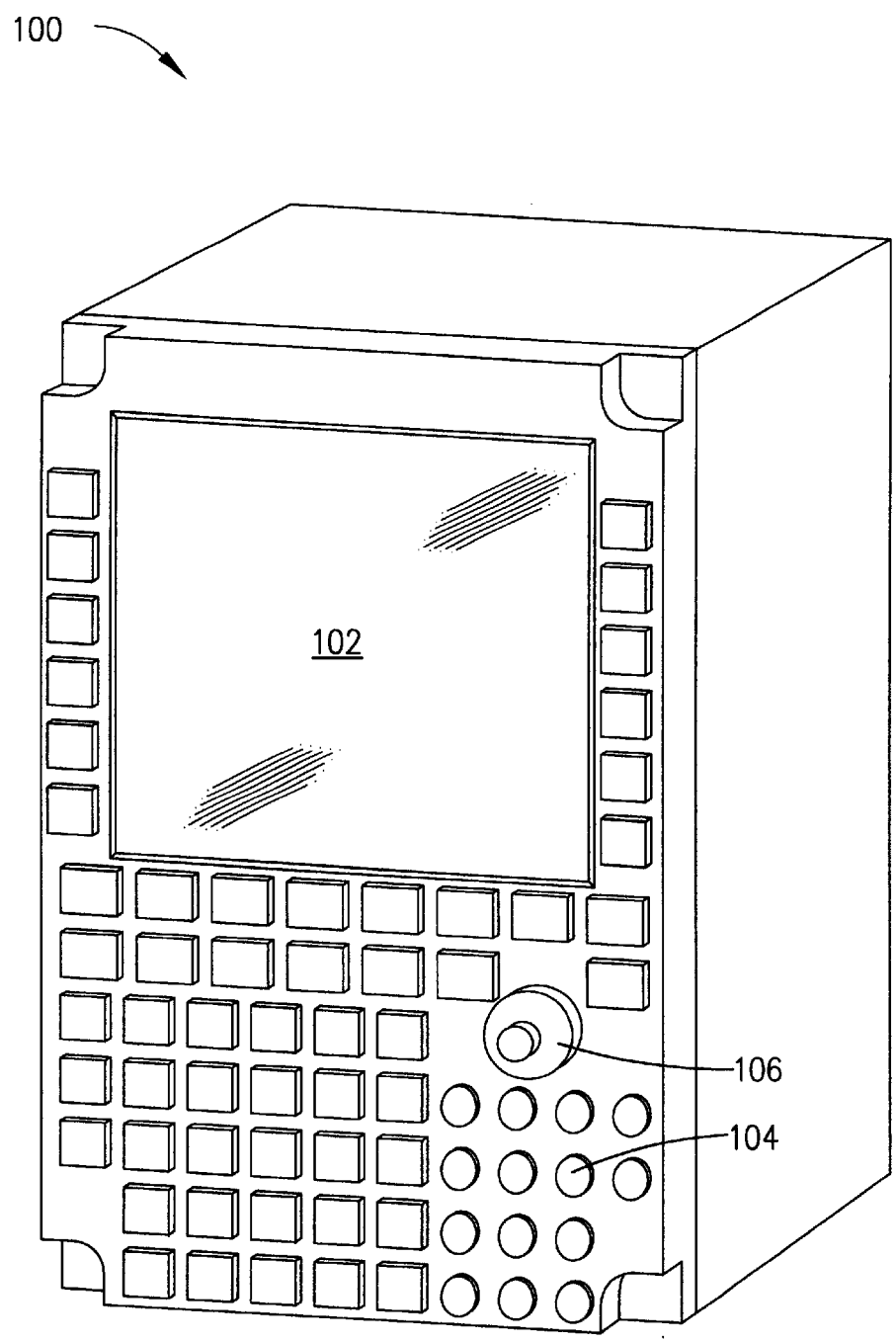
FIG. 1 shows a representation of a Multifunctional Control and Display Unit (MCDU)

FIG. 1 is a representation of a multifunction control and display unit (MCDU) which may be used as a radio controller in the instant invention. The MCDU also performs many other functions in an aircraft avionics, such as flight management, navigation, weather, terrain, and positional interface with the pilot. MCDU 100 may include or cooperate with a mode, position and/or detection element that is capable of determining the mode or position of the vehicle relative to one or more reference locations, points, planes, or navigation aids. In addition, MCDU 100 may be configured to receive, analyze, condition, and process navigation and positional information, including flight path information as well as weather information associated with the vehicle. In this regard, MCDU 100 may include any number of individual microprocessors, flight computers, navigation equipment, memories, storage devices, interface cards, and other standard components known in the art. Moreover, MCDU 100 may include any number of microprocessor elements, memory elements, power supplies, and other functional components as necessary. In this respect, MCDU 100 may include or cooperate with any number of software programs or instructions designed to carry out various methods, process tasks, calculations, control functions, and the generation of display signals and other data used by display elements in the avionics system.

MCDU 100 has a display 102 for displaying certain information, most importantly in this case information regarding the status of the navigational and communications radios on board the aircraft. MCDU 100 has a series of buttons or switches surrounding the display for entering data into various positions on the display representing the navigational and communications radios on board the aircraft. A keypad 104 is provided for entering numeric data into the MCDU 100, as may be a dual concentric knob 106 which can also be used for entering data into the MCDU 100, particularly for entering radio frequencies. All MCDUs do not have a dual concentric knob 106, as it is optional. The MCDU usually presents a screen or an area of a screen designating radio frequencies, for navigation radios and for communication radios. Navigation radio information and communications radio information may occupy different areas of the MCDU display 102.

Figure 2:
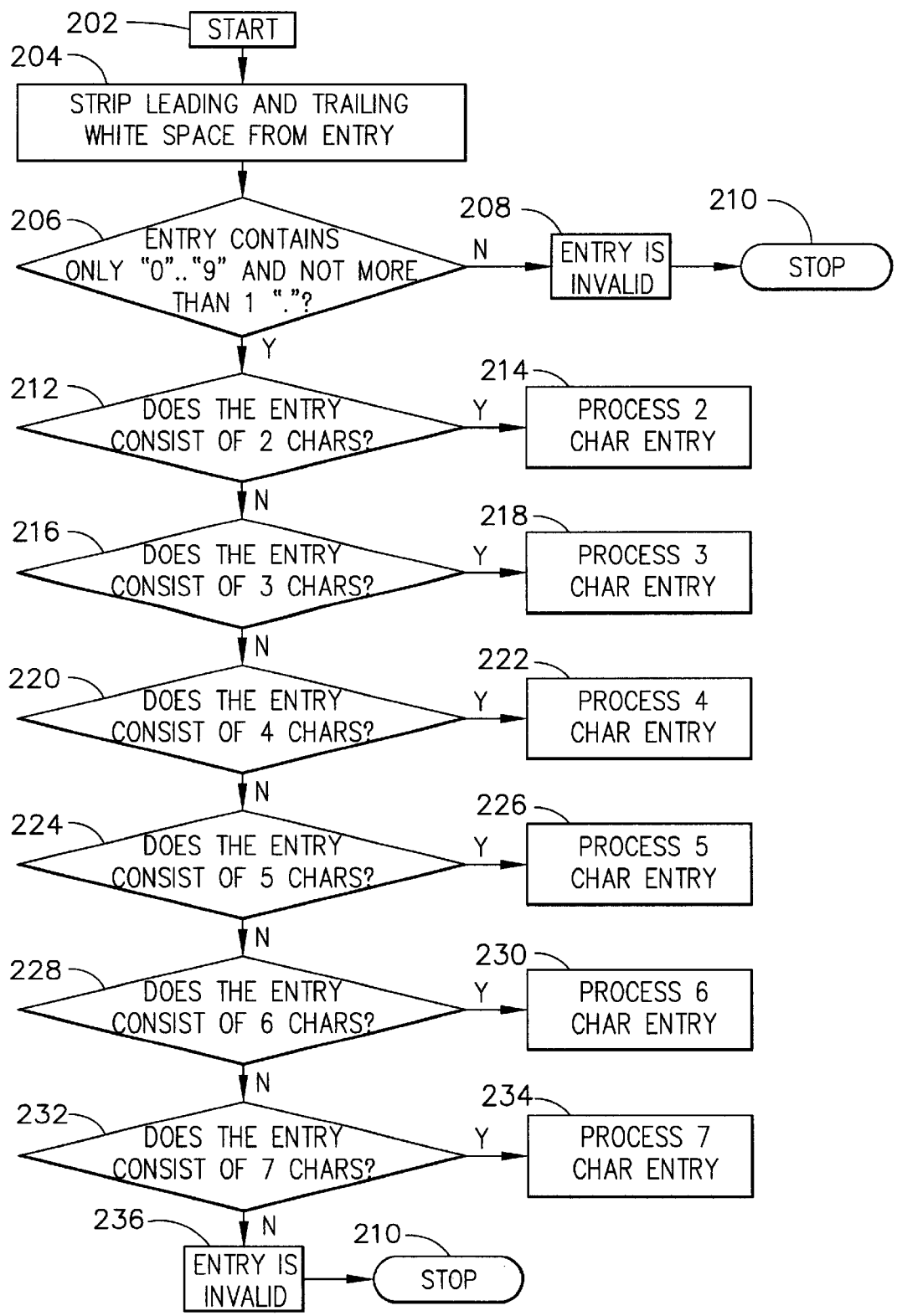
FIG. 2 is a flow diagram showing a main program of the invention for entering communication radio frequencies into a radio controller.

FIG. 2 is a flow chart that represents one method of determining an intended frequency with the entry of fewer characters than the actual frequency desired. In the case of FIG. 2 the method relates to entering frequencies for VHF communications radios. When a pilot or crewmember enters characters representing a desired frequency and indicates that the entered characters are definitive of the input by, for example, pressing an "enter" button, or by some other means, the program begins to interpret the entry at 202.

The leading and trailing "white spaces" are stripped from the entry in preparation for the parsing of the entered characters at 204.

At 206, a determination is made whether the entry contains only numerical characters, that is, numbers from 0 to 9, and whether there is more than one decimal point. If the entry contains a non-numeric character or more than one decimal point, the entry is considered invalid at 208 and the process terminated at 210.

If, at 206 it is determined that the entry indeed contains only numerical characters and no more than one decimal point, a determination is made at 212 as to how many characters are included in the entry. If the entry has two characters, the entry is processed further at 214 by the subroutine of FIG. 3. If the entry contains more than two characters the program proceeds to 216 to determine whether the entry contains three characters. If, at 216 it is determined that the entry contains three characters the program is directed by 218 to the subroutine of FIG. 4 for further processing and verification of validity of the entry.

Likewise, if the entry contains more than three characters the process continues to 220 for further processing. If the entry contains four characters, the program is directed by 222 to the subroutine of FIG. 5 for further processing and verification of validity of the entry.

Figure 6:
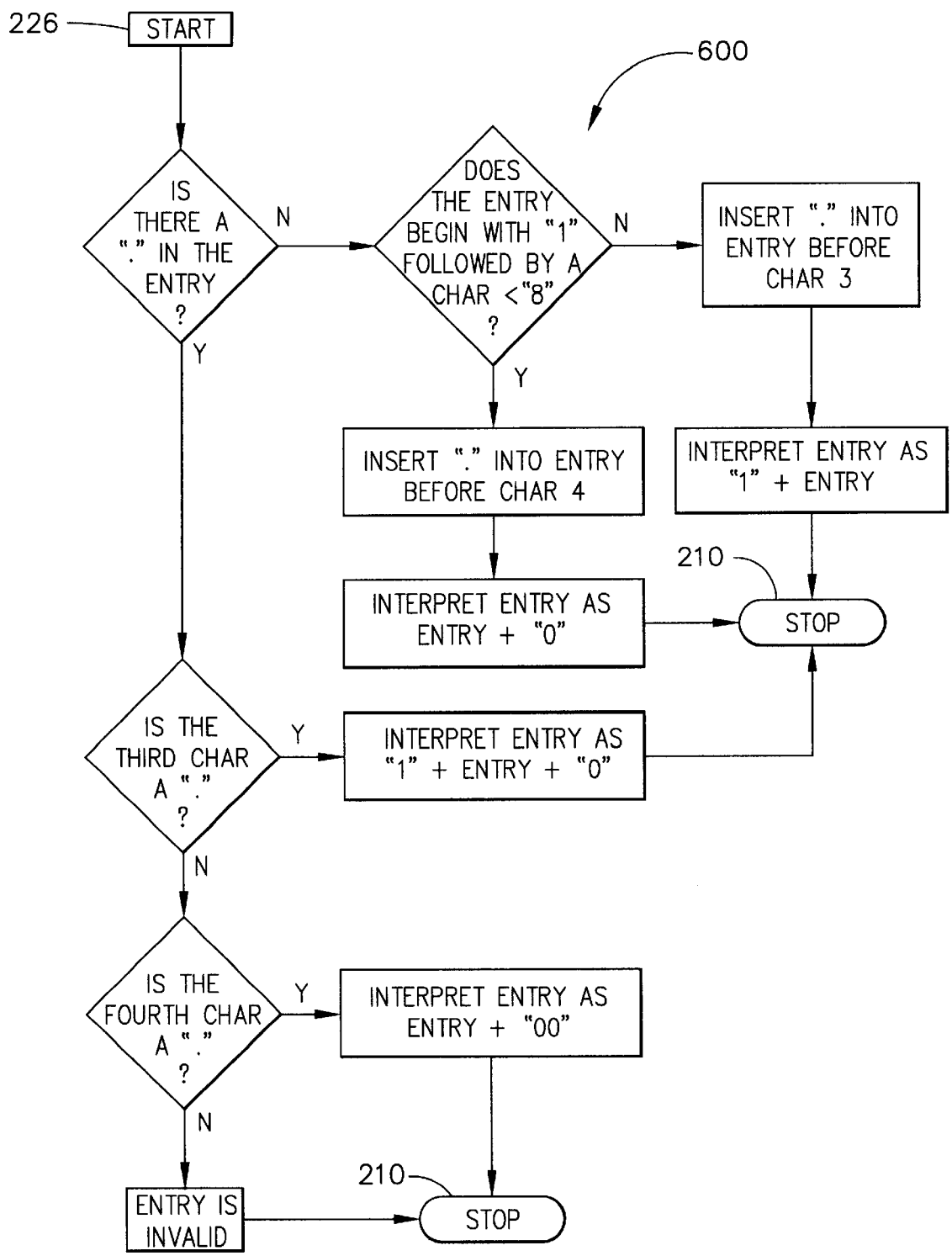
FIG. 6 is a flow diagram of a subroutine of the program of FIG. 2 for processing five-character entries of communications radio frequencies into a radio controller.
Figure 7:
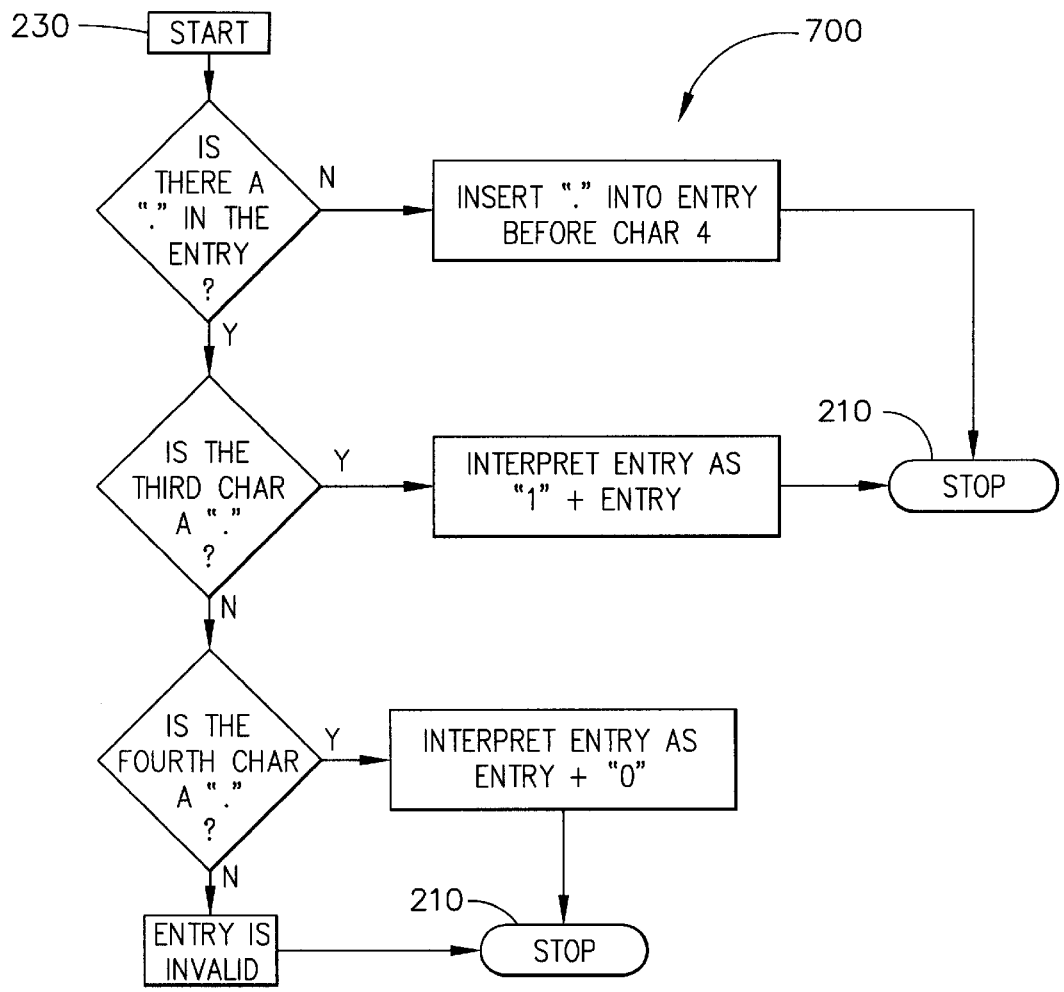
FIG. 7 is a flow diagram of a subroutine of the program of FIG. 2 for processing six-character entries of communications radio frequencies into a radio controller.
Figure 8:
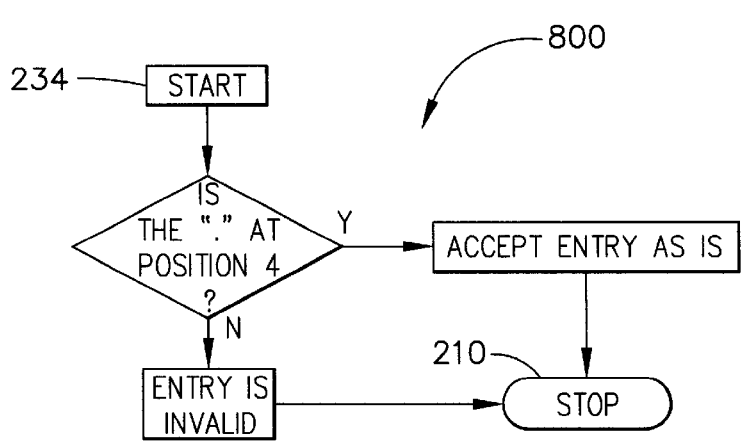
FIG. 8 is a flow diagram of a subroutine of the program of FIG. 2 for processing seven-character entries of communications radio frequencies into a radio controller.

If the entry contains five, six or seven characters as determined by steps 224, 228, or 232, respectively and the program is directed by steps 226, 230, or 234 to the appropriate subroutines of FIG. 6, FIG. 7, or FIG. 8, respectively for further processing and verification of validity of the entry.

If none of the foregoing determinations of the length of the entry is accurate, the entry is determined to be invalid at 236, and the program is stopped at 210.

Figure 3:
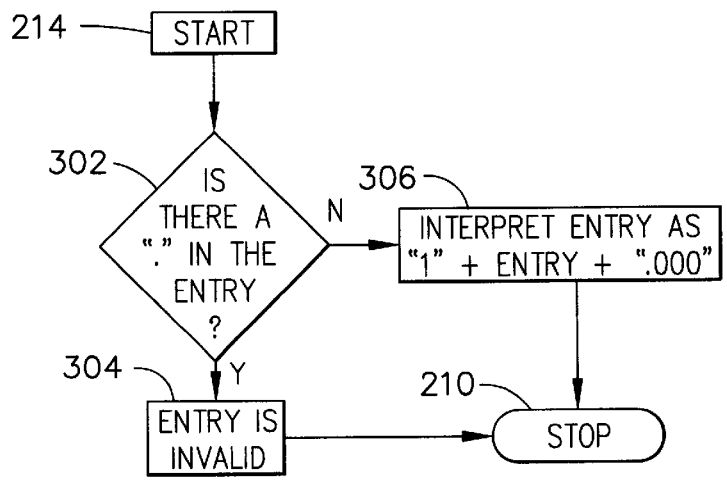
FIG. 3 is a flow diagram of a subroutine of the program of FIG. 2 for processing two character entries of communications radio frequencies into a radio controller.

FIG. 3 is a flow diagram of a subroutine for processing two character entries. It is entered from FIG. 2 from 214 after the program of FIG. 2 determines that the entry was, in fact, a two character entry. In FIG. 3 a determination is first made as to whether one of the two characters is a decimal point. If one of the characters is a decimal point, the entry is deemed invalid at 304 and the program is stopped at 210. If one of the characters is a decimal point, of course, that would leave only one numeric character, which is insufficient to define any unique frequency within the range of possible VHF communications frequencies.

If, on the other hand, both characters are numeric, the entry may be interpreted at 306 as "1" plus the entry (two numerals), plus a decimal point followed by three zeros, any combination of the two entered characters being sufficient to define a unique frequency within the range of VHF communications frequencies. Once the entry is confirmed as a possible correct frequency, the program is stopped at 210 and the full frequency is entered into the MCDU at the appropriate location, for visual verification by the pilot or crew member as to the accuracy of the entry. The pilot or crew member may then confirm the entry by pressing a button on the MCDU or by some other similar means. This is an optional step, used by some flight information systems to provide a final check on the accuracy of the entry.

Figure 4:
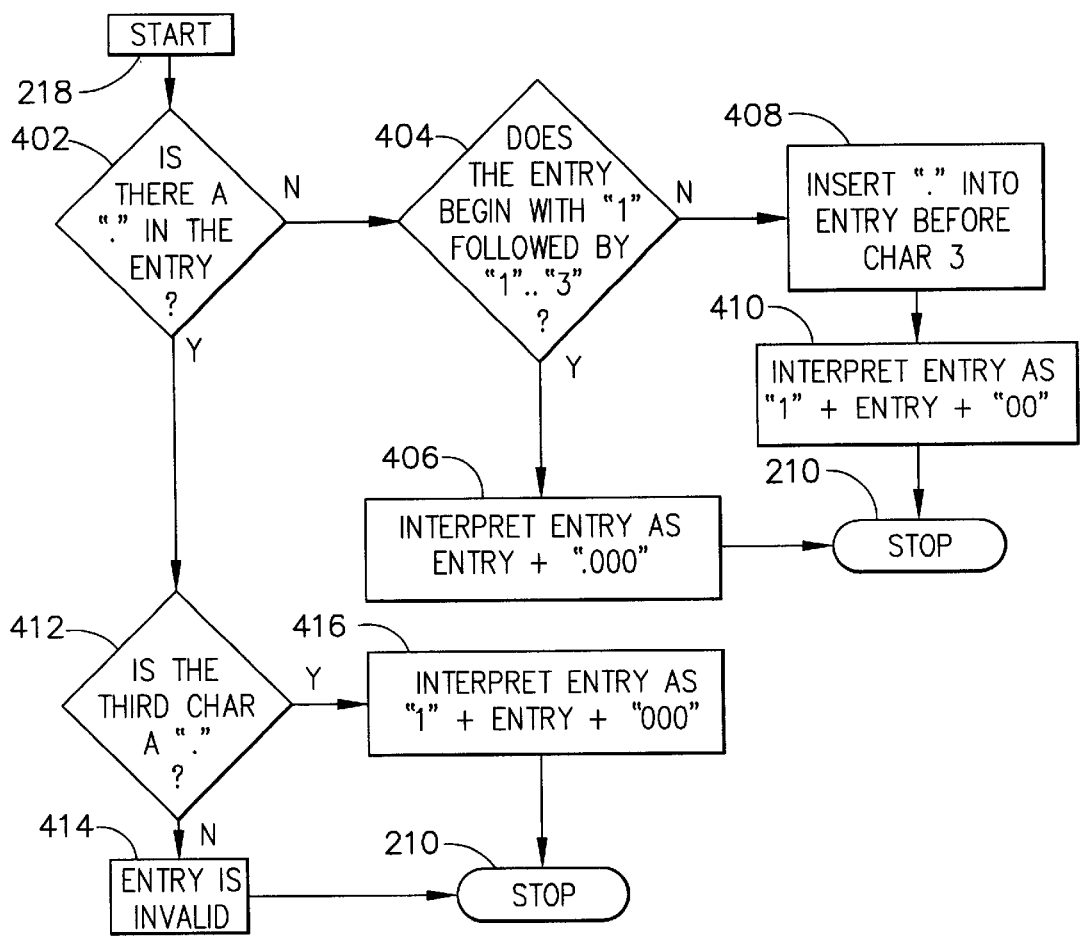
FIG. 4 is a flow diagram of a subroutine of the program of FIG. 2 for processing three-character entries of communications radio frequencies into a radio controller.

FIG. 4 is a flow diagram of a subroutine for processing entries of three characters. The subroutine is entered from the main program of FIG. 2 at 218. As with the subroutine of FIG. 3, a determination is first made as to whether one of the characters is a decimal point at 402. If none of the characters is a decimal point a determination is made at 404 whether the entry begins with a "1" followed by two numeric characters between "1" and "3". If so, the entry is interpreted at 406 as the entry plus "0.000" and the program is stopped at 210. Any time the program is stopped at 210 and a valid entry has been determined, the full frequency is entered in the MCDU display 102 and verified and accepted by the pilot or crewmember as previously described with reference to FIG. 3. If the entry did not begin with a "1" followed by two characters between "1" and "3", at 408 a decimal point is inserted between the second and third characters and at 410 the frequency is interpreted as 1 plus the entry plus "00", after which the program is stopped at 210 and the entry of the frequency into the MCDU display 102 and its verification take place.

If at 402 there was a decimal point in the entry, it is determined whether the decimal point was the third character. If not, the entry is determined to be invalid at 414 and the program is stopped at 210. Since the entry was invalid, a notice to that effect is displayed on the MCDU display 102 to alert the pilot or crew of the need to re-enter a valid frequency. If the third character is a decimal point, the entry is interpreted at 416 to be "1" plus the entry plus "000", the program is stopped at 210 and the entry of the frequency and its verification take place.

Figure 5:
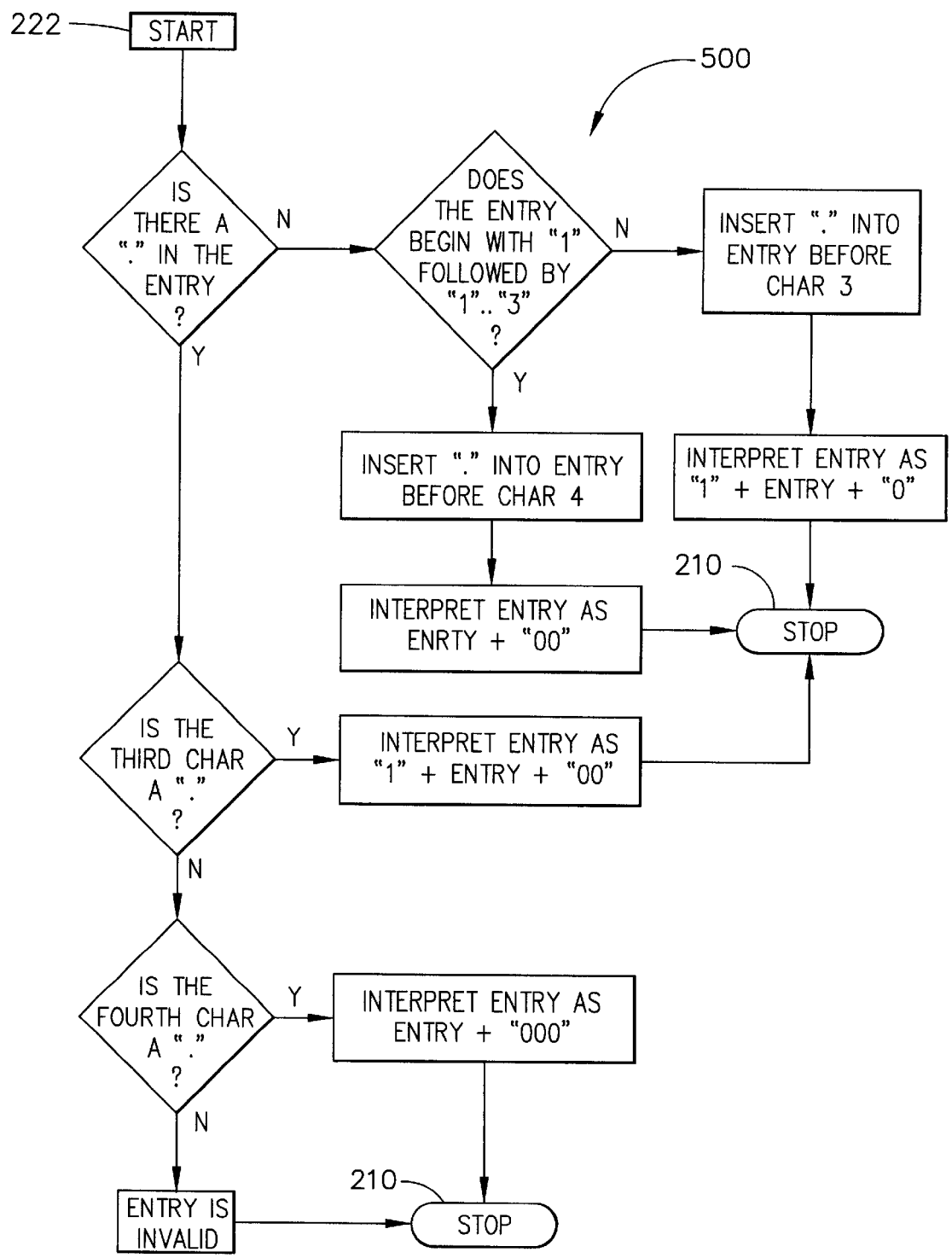
FIG. 5 is a flow diagram of a subroutine of the program of FIG. 2 for processing four-character entries of communications radio frequencies into a radio controller.

FIG. 5 is a flow diagram 500 of a subroutine of the main program of FIG. 2 for processing entries having four characters, FIG. 6 is a is a flow diagram 600 of a subroutine of the main program of FIG. 2 for processing entries having five characters, FIG. 7 is a flow diagram of a subroutine 700 of the main program of FIG. 2 for processing entries having six characters, and FIG. 8 is a is a flow diagram of a subroutine 800 of the main program of FIG. 2 for processing entries having seven characters.

These subroutines 500, 600, 700, and 800 are entered from the main program of FIG. 2 for entering VHF communications frequencies, at 222, 226, 230, and 234, respectively. Having described the operation of the subroutines of FIG. 3 and FIG. 4 in some detail above, it should be apparent as to how the subroutines 500, 600, 700, and 800 are structured and how they interpret various combinations of entries of characters representing frequencies of VHF communications radios.

Figure 9:
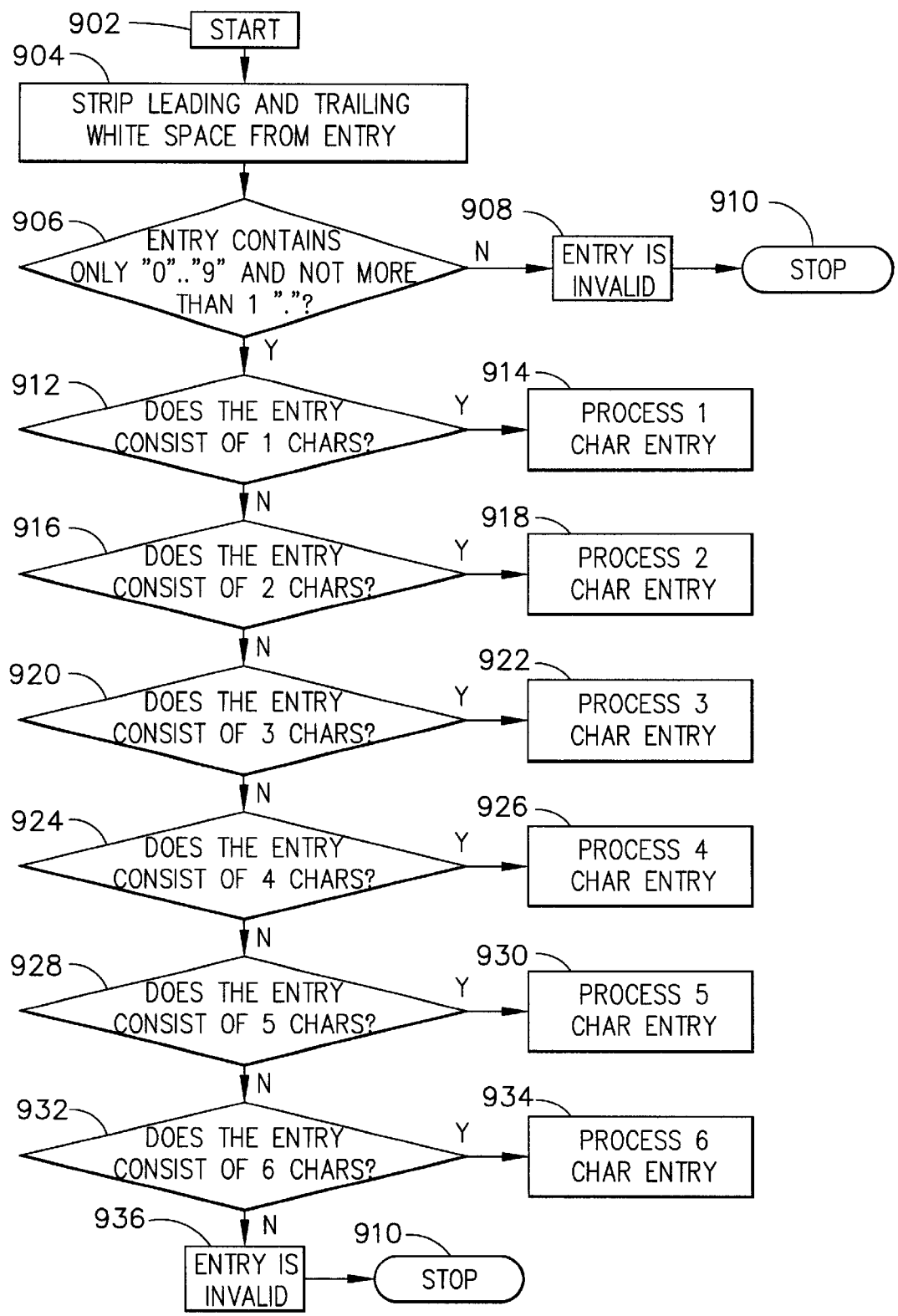
FIG. 9 is a flow diagram showing a main program of the invention for entering VHF navigation radio frequencies into a radio controller.

FIG. 9 is a flow diagram of a main program for interpreting entries of partial frequencies of VHF navigation radios; usually VHF Omni-directional Range radios (VORs). When a pilot or crewmember enters characters representing a desired frequency and indicates that the entered characters are definitive of the input by, for example, pressing an "enter" button, or by some other means, the program begins to interpret the entry at 902.

The leading and trailing "white spaces" are stripped from the entry in preparation for the parsing of the entered characters at 904.

At 906, a determination is made whether the entry contains only numerical characters, that is, numbers from 0 to 9, and whether there is more than one decimal point. If the entry contains a non-numeric character or more than one decimal point, the entry is considered invalid at 908 and the process is terminated at 910.

If, at 906 it is determined that the entry indeed contains only numerical characters and no more than one decimal point, a determination is made at 912 as to how many characters are included in the entry. If the entry has one character, the entry is processed further at 914 by the subroutine of FIG. 10. If the entry contains more than one character the program proceeds to 916 to determine whether the entry contains two characters. If, at 916 it is determined that the entry contains two characters the program is directed by 918 to the subroutine of FIG. 11 for further processing and verification of validity of the entry.

Likewise, if the entry contains more than two characters the process continues to 920 for further processing. If the entry contains three characters, the program is directed by 922 to the subroutine of FIG. 12 for further processing and verification of validity of the entry.

Figure 13:
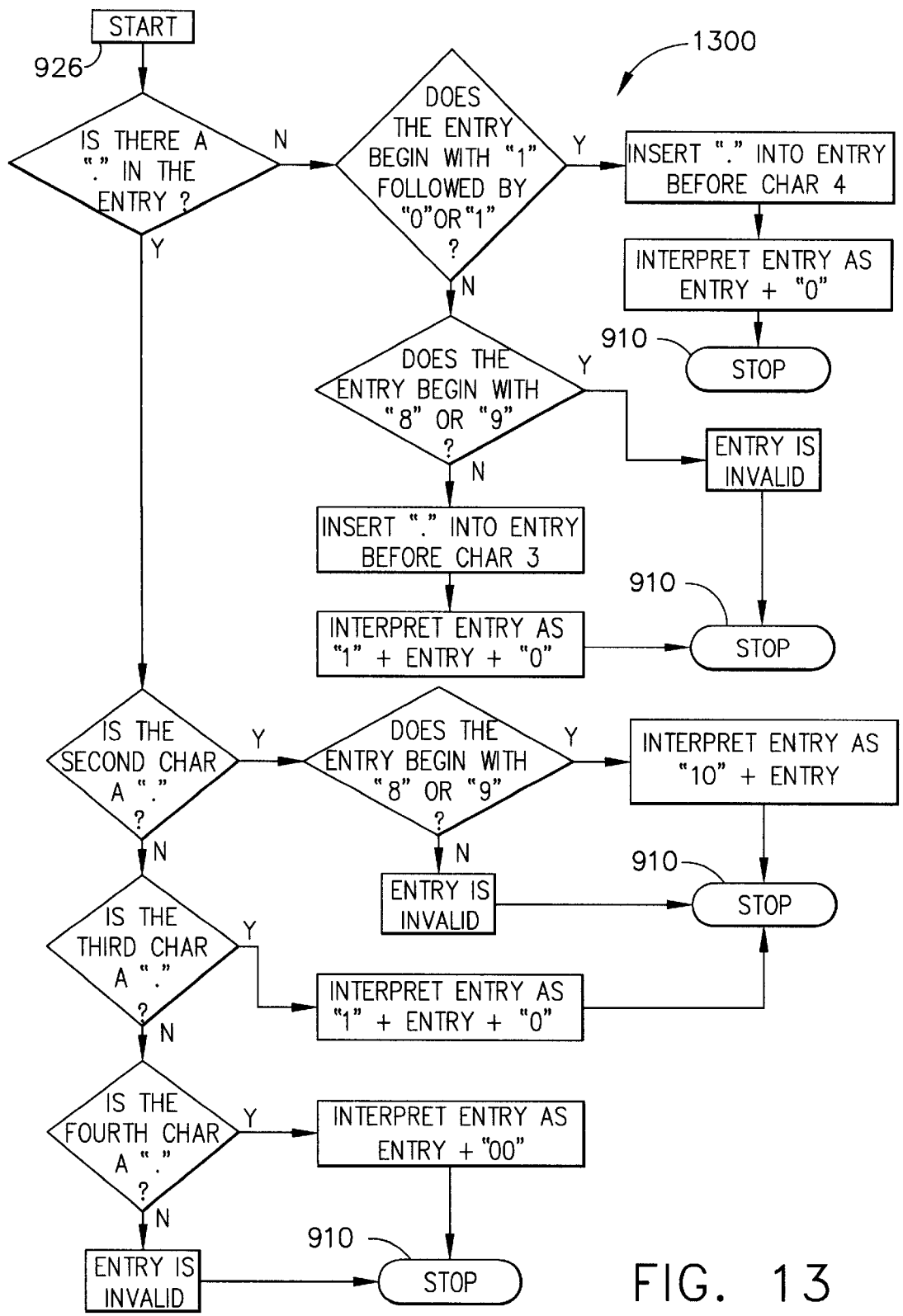
FIG. 13 is a flow diagram of a subroutine of the program of FIG. 9 for processing four-character entries of VHF navigation radio frequencies into a radio controller.
Figure 14:
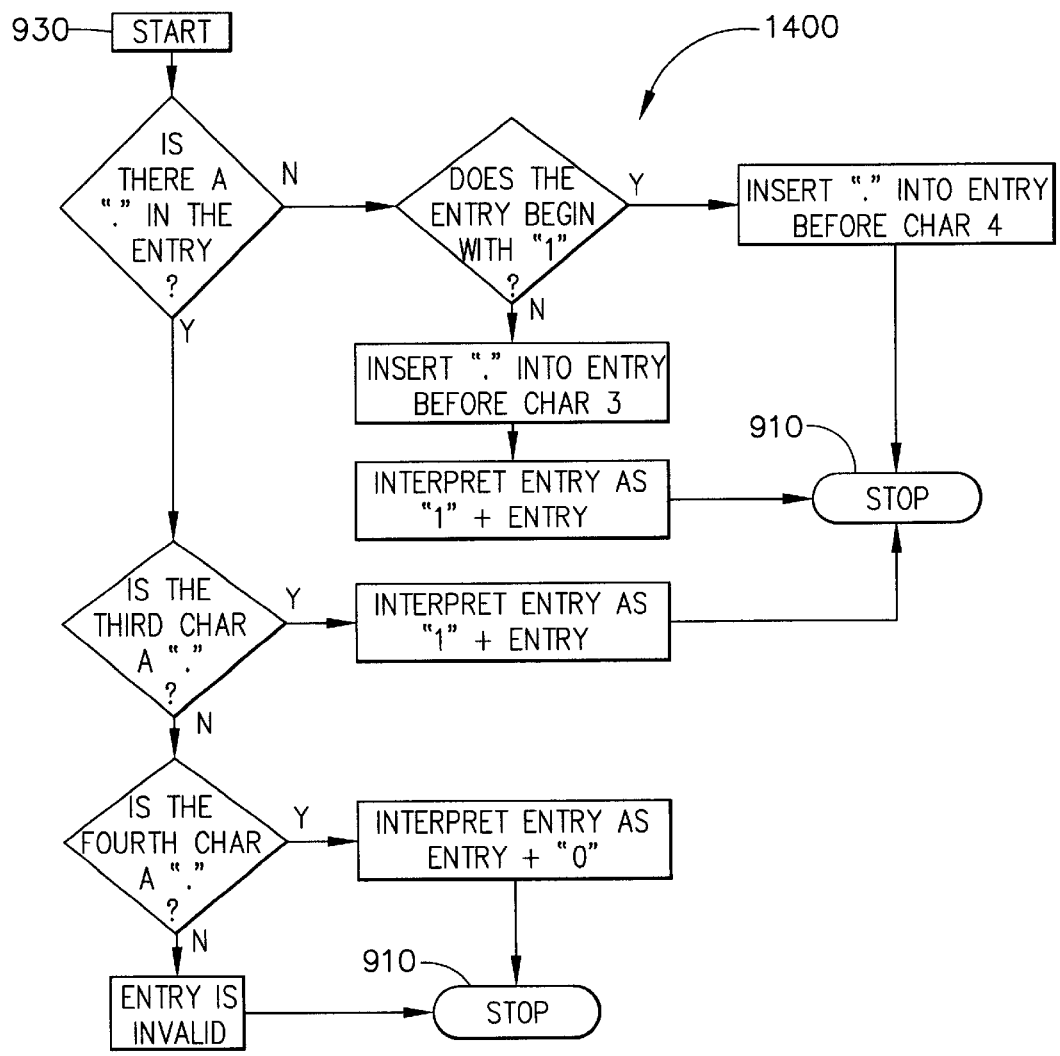
FIG. 14 is a flow diagram of a subroutine of the program of FIG. 9 for processing five-character entries of VHF navigation radio frequencies into a radio controller.
Figure 15:
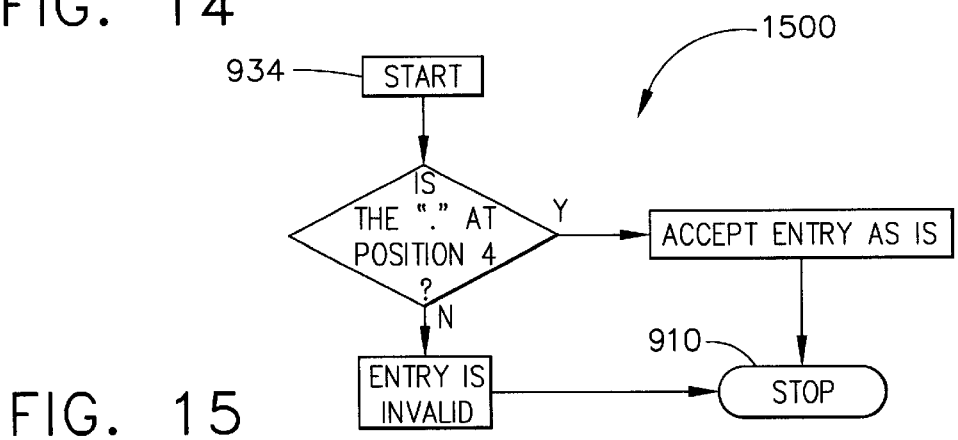
FIG. 15 is a flow diagram of a subroutine of the program of FIG. 9 for processing six-character entries of VHF navigation radio frequencies into a radio controller.

If the entry contains four, five, or six characters as determined by steps 924, 928, or 932, respectively and the program is directed by steps 926, 930, or 934 to the appropriate subroutines of FIG. 13, FIG. 14, or FIG. 15, respectively for further processing and verification of validity of the entry.

If none of the foregoing determinations of the length of the entry is accurate, the entry is determined to be invalid at 936, and the program is stopped at 910.

Figure 10:
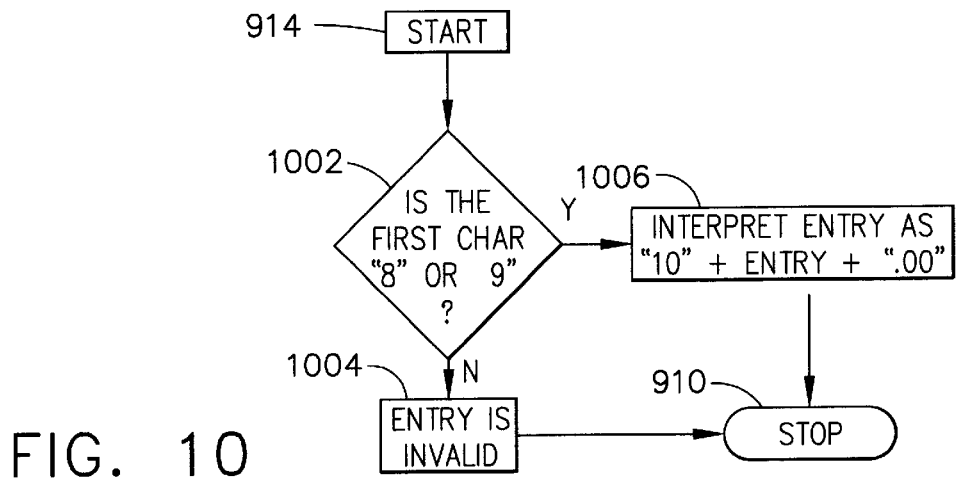
FIG. 10 is a flow diagram of a subroutine of the program of FIG. 9 for processing one-character entries of VHF navigation radio frequencies into a radio controller.

FIG. 10 is a flow diagram of a subroutine for processing one character entries. It is entered from FIG. 9 from 914 after the program of FIG. 9 determines that the entry was, in fact, a one character entry. In FIG. 10 a determination is first made at 1002 whether the character is an "8" or "9". If the character is not an "8" or "9", the entry is determined at 1004 to be invalid, and the subroutine is stopped at 910. An appropriate message may be displayed on the MCDU display 102 alerting the pilot or crew to take corrective action in entering a new set of characters to define a navigation frequency. If the entry is an "8" or "9", the entry is interpreted at 1006 to be "10" plus the entry plus "0.00". That is, if the character is an "8", the frequency would be interpreted as "108.00", a valid navigation radio frequency.

Figure 11:
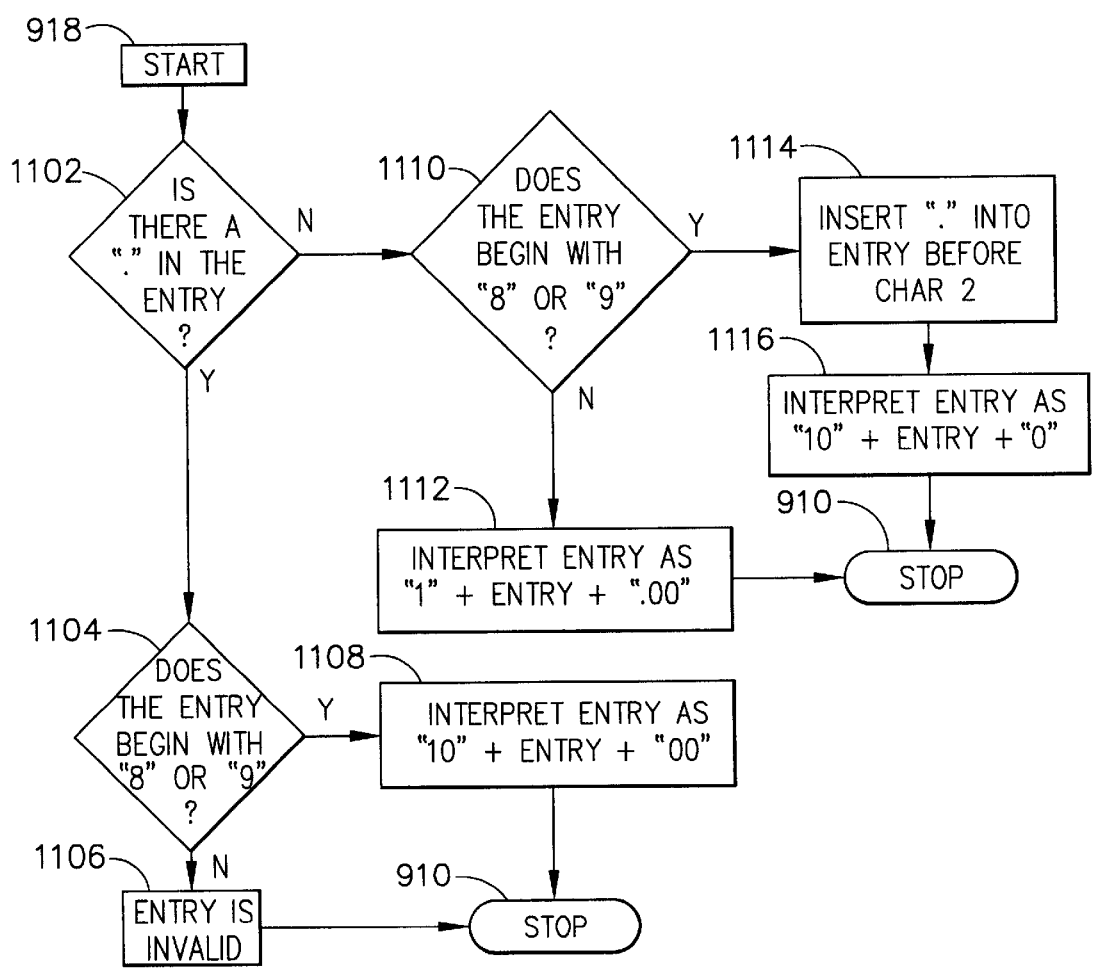
FIG. 11 is a flow diagram of a subroutine of the program of FIG. 9 for processing two-character entries of VHF navigation radio frequencies into a radio controller.

FIG. 11 is a flow diagram of a subroutine for processing two character entries. It is entered from FIG. 9 from 918 after the program of FIG. 9 determines that the entry was, in fact, a two character entry. In FIG. 11 a determination is first made at 1102 as to whether one of the two characters is a decimal point. If one of the characters is a decimal point, a determination is made at 1104 as to whether the entry begins with an "8" or a "9". If the entry does not begin with an "8" or a "9", the entry is deemed invalid at 1106 and the program is stopped at 910.

If the entry has a decimal point and begins with an "8" or a "9", the entry is interpreted as "10" plus the entry plus "00". For example, if the entry is an "8", the entry is interpreted at 1008 to be "10" plus "8." plus "00". That is, if the character is an "8", the frequency would be interpreted as "108.00", a valid navigation radio frequency.

If, on the other hand, both characters are numeric, a determination is made at 1110 whether the entry begins with an "8" or a "9". If the entry does not begin with an "8" or a "9", the entry is interpreted at 1012 as "1 plus the entry plus "0.00" and the subroutine is stopped at 910 and an entry is made in the MCDU display for confirmation and acceptance. If the entry begins with "8" or "9", a decimal point is inserted into the entry before the second character at 1114 and the entry is interpreted at 1116 as "10" plus the entry plus "0", the entered characters being sufficient to define a unique frequency. Once the entry is confirmed as a possible correct frequency, the program is stopped at 910 and the full frequency is entered into the MCDU at the appropriate location, for visual verification by the pilot or crew member as to the accuracy of the entry. The pilot or crew member may then confirm the entry by pressing a button on the MCDU or by some other similar means. Not all systems require this last step.

Figure 12:
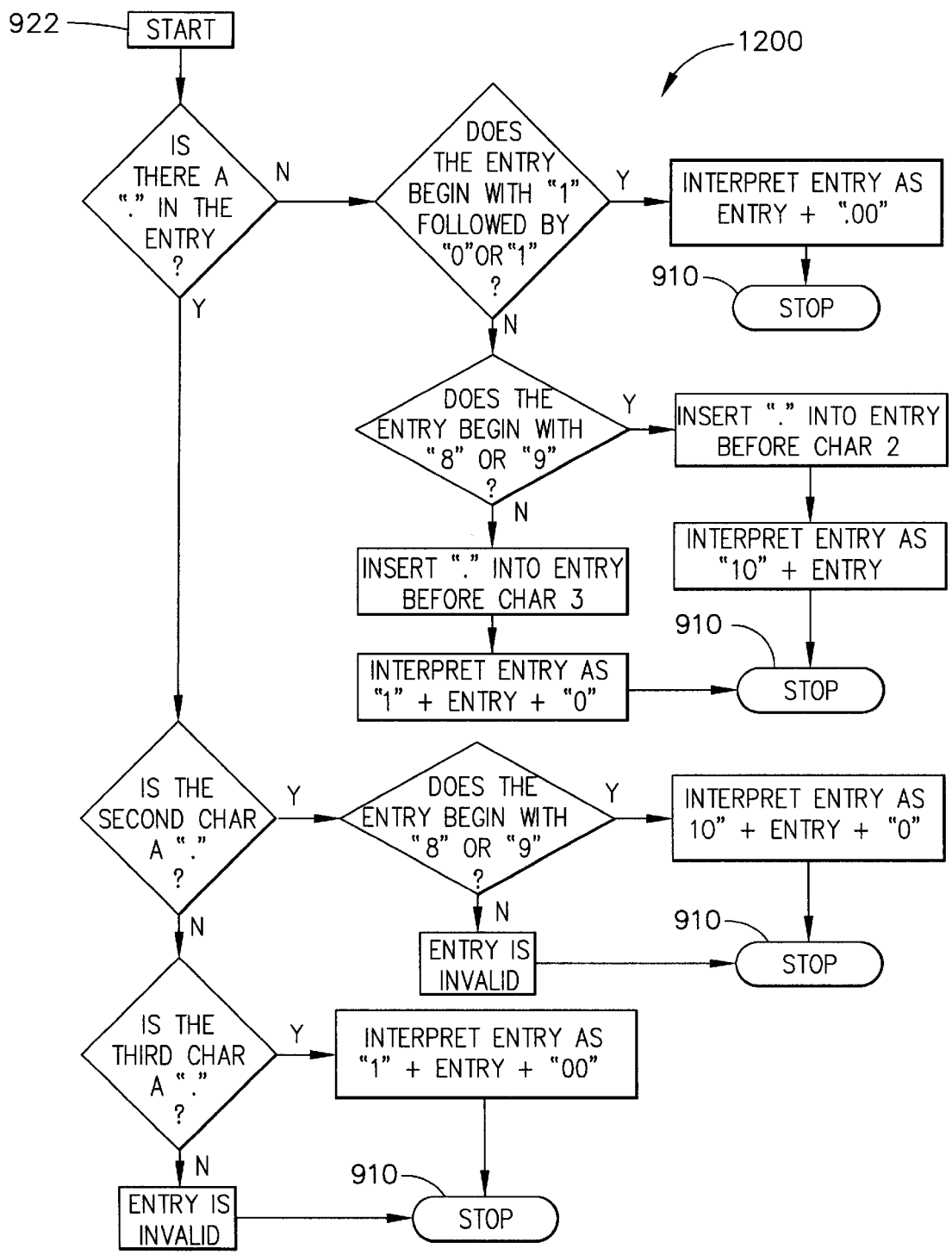
FIG. 12 is a flow diagram of a subroutine of the program of FIG. 9 for processing three-character entries of VHF navigation radio frequencies into a radio controller.

FIG. 12 is a flow diagram 1200 of a subroutine of the main program of FIG. 9 for processing entries having three characters, FIG. 13 is a is a flow diagram 1300 of a subroutine of the main program of FIG. 9 for processing entries having four characters, FIG. 14 is a flow diagram of a subroutine 1400 of the main program of FIG. 9 for processing entries having five characters, and FIG. 15 is a is a flow diagram of a subroutine 1500 of the main program of FIG. 9 for processing entries having six characters.

These subroutines 1200, 1300, 1400, and 1500 are entered from the main program of FIG. 9 for entering VHF navigation frequencies, at 922, 926, 930, and 934, respectively. Having described the operation of the subroutines of FIG. 10 and FIG. 12 in some detail above, it should be apparent as to how the subroutines 1200, 1300, 1400, and 1500 are structured and how they interpret various combinations of entries of characters representing frequencies of VHF navigation radios.

Figure 16:
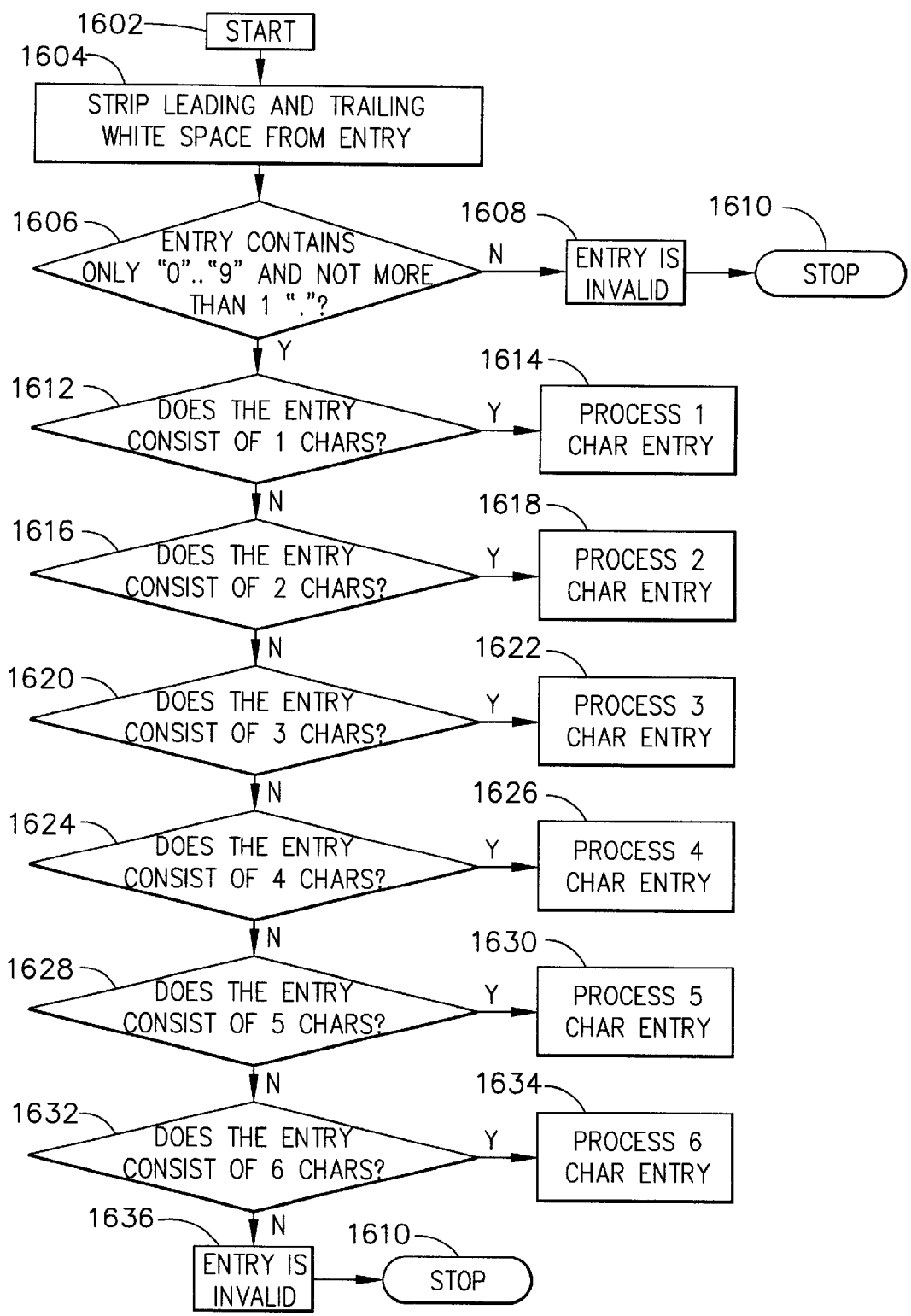
FIG. 16 a flow diagram showing a main program of,the invention for entering ADF navigation radio frequencies into a radio controller.

FIG. 16 is a flow diagram of a main program for interpreting entries of partial frequencies of Automatic Direction Finding (ADF) navigation radios. When a pilot or crewmember enters characters representing a desired frequency and indicates that the entered characters are definitive of the input by, for example, pressing an "enter" button, or by some other means, the program begins to interpret the entry at 1602.

The leading and trailing "white spaces" are stripped from the entry in preparation for the parsing of the entered characters at 1604.

At 1606, a determination is made whether the entry contains only numerical characters, that is, numbers from 0 to 9, and whether there is more than one decimal point. If the entry contains a non-numeric character or more than one decimal point, the entry is considered invalid at 1608 and the process is terminated at 1610.

If, at 1606 it is determined that the entry indeed contains only numerical characters and no more than one decimal point, a determination is made at 1612 as to how many characters are included in the entry. If the entry has one character, the entry is processed further at 1614 by the subroutine of FIG. 17. If the entry contains more than one character the program proceeds to 1614 to determine whether the entry contains two characters. If, at 1616 it is determined that the entry contains two characters the program is directed by 1618 to the subroutine of FIG. 18 for further processing and verification of validity of the entry.

Likewise, if the entry contains more than two characters the process continues to 1620 for further processing. If the entry contains three characters, the program is directed by 1622 to the subroutine of FIG. 19 for further processing and verification of validity of the entry.

Figure 20:
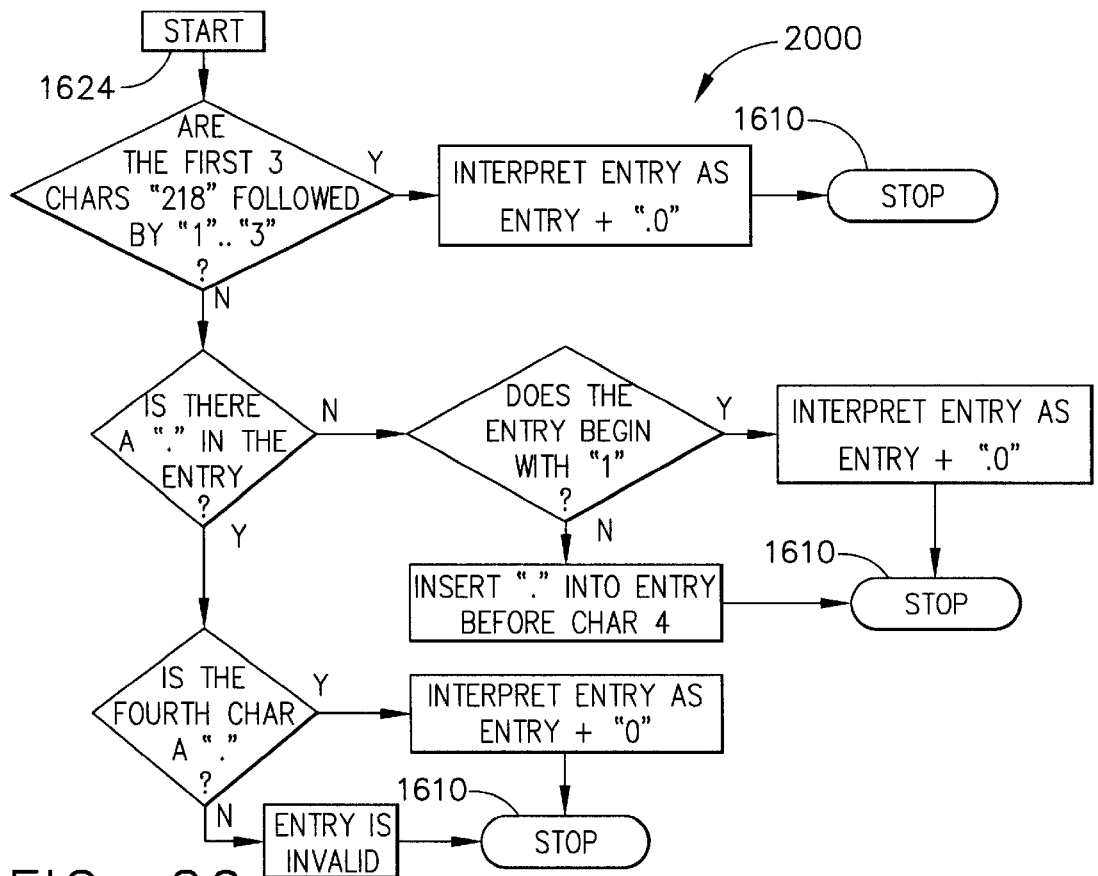
FIG. 20 is a flow diagram of a subroutine of the program of FIG. 16 for processing four-character entries of ADF navigation radio frequencies into a radio controller.
Figure 21:
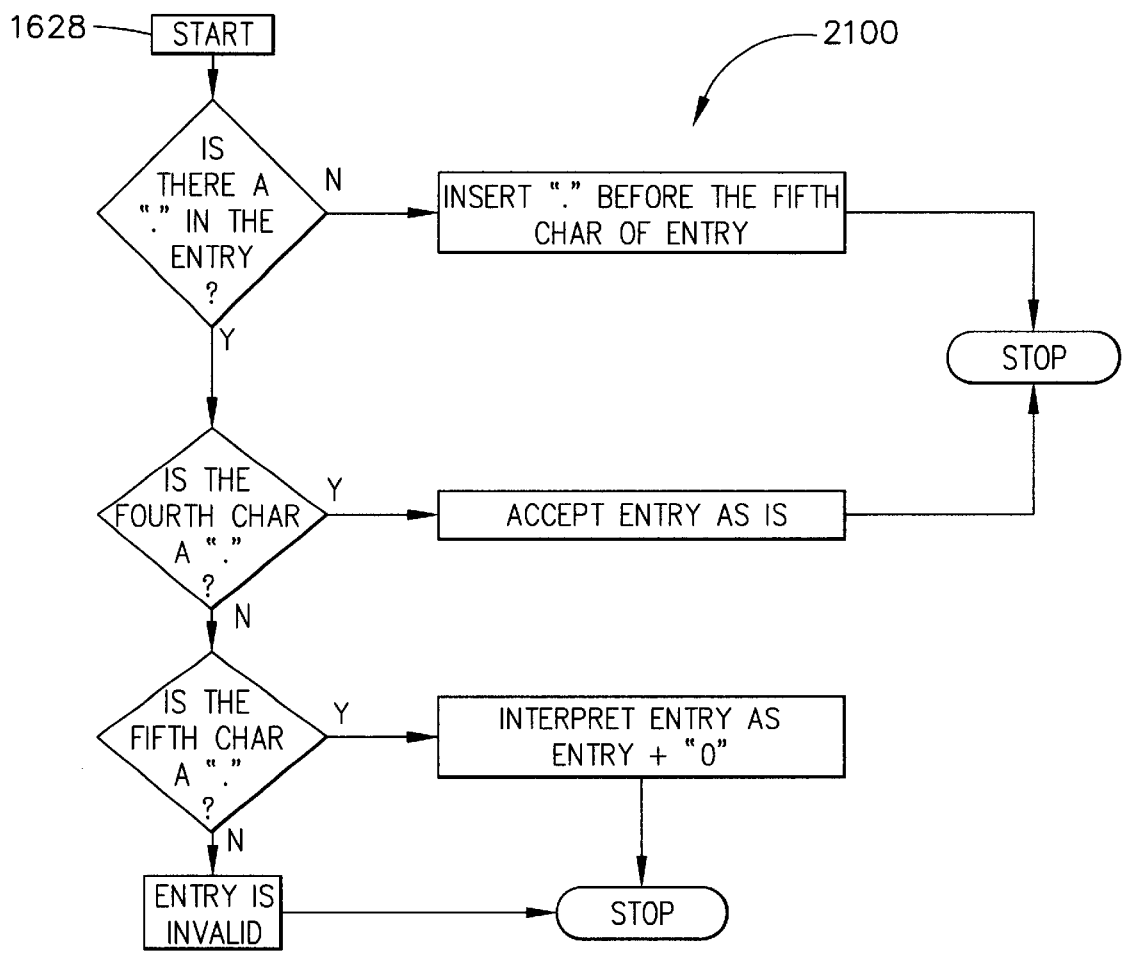
FIG. 21 is a flow diagram of a subroutine of the program of FIG. 16 for processing five-character entries of ADF navigation radio frequencies into a radio controller.
Figure 22:
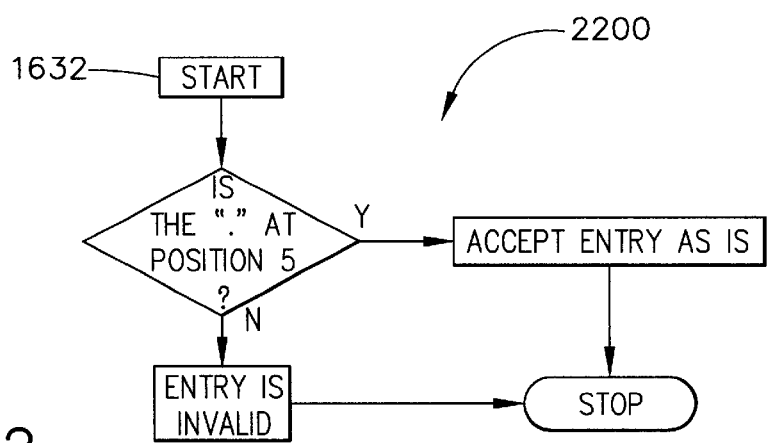
FIG. 22 is a flow diagram of a subroutine of the program of FIG. 16 for processing six-character entries of ADF navigation radio frequencies into a radio controller.

If the entry contains four, five, or six characters as determined by steps 1624, 1628, or 1632, respectively and the program is directed by steps 1626, 1630, or 1634 to the appropriate subroutines of FIG. 20, FIG. 21, or FIG. 22, respectively for further processing and verification of validity of the entry.

If none of the foregoing determinations of the length of the entry is accurate, the entry is determined to be invalid at 1636, and the program is stopped at 1610.

Figure 17:
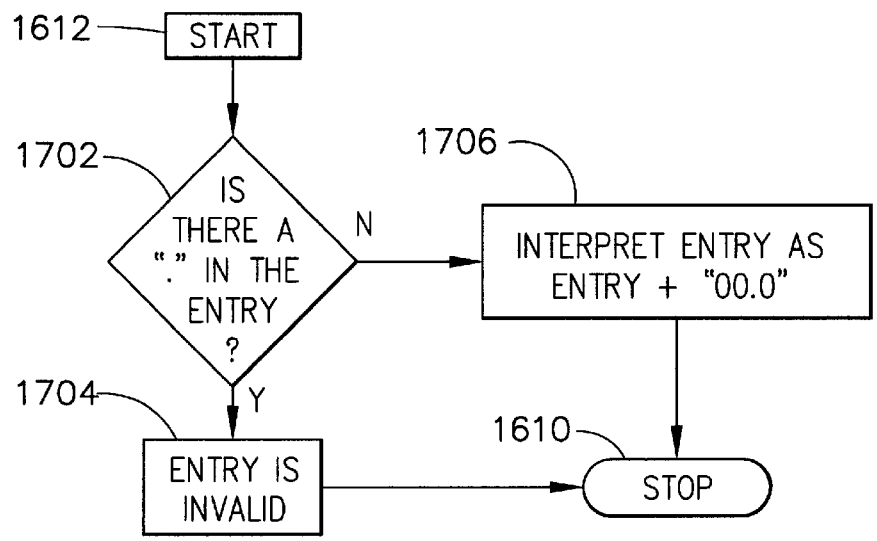
FIG. 17 is a flow diagram of a subroutine of the program of FIG. 16 for processing one-character entries of ADF navigation radio frequencies into a radio controller.

FIG. 17 is a flow diagram of a subroutine for processing one character entries. It is entered from FIG. 16 from 1614 after the program of FIG. 16 determines that the entry was, in fact, a one character entry. In FIG. 17 a determination is first made at 1702 whether one of the characters is a decimal point. If there is a decimal point, the entry is determined at 1704 to be invalid, and the subroutine is stopped at 1610. An appropriate message may be displayed on the MCDU display 102 alerting the pilot or crew to take corrective action in entering a new set of characters to define a navigation frequency. If the entry does not include a decimal point, the entry is interpreted at 1706 to be the entry plus "00.0".

Figure 18:
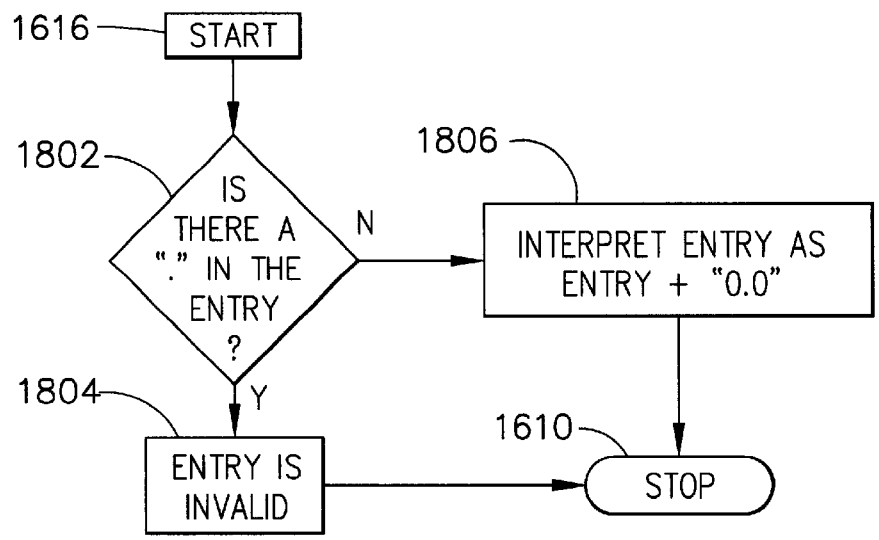
FIG. 18 is a flow diagram of a subroutine of the program of FIG. 16 for processing two-character entries, of ADF navigation radio frequencies into a radio controller.

FIG. 18 is a flow diagram of a subroutine for processing two character entries. It is entered from FIG. 16 from 1618 after the program of FIG. 16 determines that the entry was, in fact, a two character entry. In FIG. 18 a determination is first made at 1802 as to whether one of the two characters is a decimal point. If one of the characters is a decimal point, the entry is deemed invalid at 1804 and the program is stopped at 1610.

If, on the other hand, both characters are numeric, the entry is interpreted at 1806 as the entry plus "0.0" and the subroutine is stopped at 1610 and an entry is made in the MCDU display for confirmation and acceptance.

Figure 19:
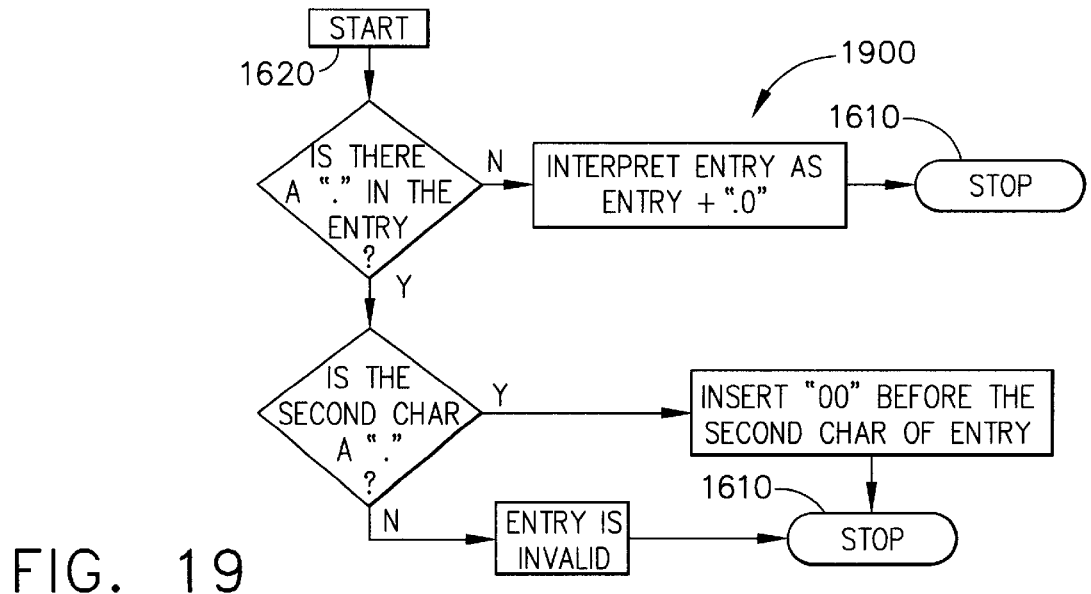
FIG. 19 is a flow diagram of a subroutine of the program of FIG. 16 for processing three-character entries of ADF navigation radio frequencies into a radio controller.

FIG. 19 is a flow diagram 1900 of a subroutine of the main program of FIG. 16 for processing entries having three characters, FIG. 20 is a flow diagram 2000 of a subroutine of the main program of FIG. 16 for processing entries having four characters, FIG. 21 is a flow diagram of a subroutine 2100 of the main program of FIG. 16 for processing entries having five characters, and FIG. 22 is a is a flow diagram of a subroutine 2200 of the main program of FIG. 16 for processing entries having six characters.

These subroutines 1900, 2000, 2100, and 2200 are entered from the main program of FIG. 16 for entering ADF navigation frequencies, at 1622, 1626, 1630, and 1634, respectively. Having described the operation of the subroutines of FIG. 17 and FIG. 18 in some detail above, it should be apparent as to how the subroutines 1900, 2000, 2100, and 2200 are structured and how they interpret various combinations of entries of characters representing frequencies of ADF navigation radios.

Thus there has been provided a method for entering partial information regarding certain communications and navigation radio frequencies wherein the partial frequency characters are examined to determine whether enough information has been provided by the partial entry to allow the program in which the method is preferably embodied to determine that a unique actual frequency can be determined.

While an exemplary embodiment(s) has been presented in the foregoing detailed description of the invention, it should be appreciated that a vast number of variations exist. It should also be appreciated that these exemplary embodiments are only examples, and are not intended to limit the scope, applicability, or configuration of the invention in any way. Rather, the foregoing detailed description will provide those skilled in the art with a convenient road map for implementing a preferred embodiment of the invention. It being understood that various changes may be made in the function and arrangement of elements described in an exemplary preferred embodiment without departing from the spirit and scope of the invention as set forth in the appended claims.

What is claimed is:

1. A method for expediting the entry of a radio frequency into a radio control device by allowing entry of only a portion of the actual frequency desired comprising the steps of:

parsing the portion of the actual frequency entered, comparing the portion of the actual frequency entered to known characteristics of permissible frequencies, choosing a permissible frequency that is uniquely compatible with the portion of the actual frequency entered, and entering the uniquely compatible frequency into the radio control device.

2. A method as set forth in claim 1 wherein the portion of the actual frequency comprises fewer characters than the permissible frequency.

3. A method as set forth in claim 1 wherein the permissible frequency is a navigation frequency.

4. A method as set forth in claim 1 wherein the permissible frequency is a communications frequency.

5. A method as set forth in claim 1 wherein parsing the portion of the actual frequency entered comprises examining the portion of the actual frequency entered to determine whether there is appropriate information for a permissible frequency to be calculated.

6. A method as set forth in claim 5 further comprising determining whether one of the characters entered is a decimal point.

7. A method as set forth in claim 6 further comprising if a character entered is a decimal point, determining in which position the decimal point is placed.

8. A method as set forth in claim 7 wherein the location of the decimal point may determine whether a portion of the frequency entered can include a permissible frequency.

9. A method as set forth in claim 5 further comprising, upon determination that appropriate information does not exist, terminating the method.

10. A method as set forth in claim 5 further comprising, upon determination that appropriate information may exist the remainder of the actual frequency entered is examined to determine the permissible frequency.

11. A method as set forth in claim 10 wherein the portion of the actual frequency comprises fewer characters than the permissible frequency.

12. A method as set forth in claim 10 wherein the permissible frequency is a navigation frequency.

13. A method as set forth in claim 10 wherein the permissible frequency is a communications frequency.

14. A method as set forth in claim 10 wherein parsing the portion of the actual frequency entered comprises examining the portion of the actual frequency entered to determine whether there is appropriate information for a permissible frequency to be calculated.

15. A method as set forth in claim 14 further comprising determining whether one of the characters entered is a decimal point.

16. A method as set forth in claim 15 further comprising if a character entered is a decimal point, determining in which position the decimal point is placed.

17. A method as set forth in claim 16 wherein the location of the decimal point may determine whether a portion of the frequency entered can include a permissible frequency.

18. A method as set forth in claim 14 further comprising, upon determination that appropriate information does not exist, terminating the method.

19. A method as set forth in claim 14 further comprising, upon determination that appropriate information may exist the remainder of the actual frequency entered is examined to determine the permissible frequency.

20. A method for completing the entry of a radio frequency into a radio control device based on entry of only a portion of the actual frequency desired comprising the steps of:

accepting characters representing a portion of the actual frequency entered, determining whether the characters entered can identify the structure of a permissible frequency, determining whether the characters entered can uniquely identify a permissible frequency, choosing a permissible frequency that is uniquely compatible with the portion of the actual frequency entered, and entering the uniquely compatible frequency into the radio control device.

* * * * *